(12) United States Patent
Dong et al.

(10) Patent No.: US 11,703,559 B2
(45) Date of Patent: Jul. 18, 2023

(54) MAGNETIC RESONANCE IMAGING METHOD AND MAGNETIC RESONANCE IMAGING SYSTEM

(71) Applicant: Siemens Healthcare GmbH, Erlangen (DE)

(72) Inventors: Fang Dong, Shenzhen (CN); De He Weng, Shenzhen (CN); Nan Xiao, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/716,001

(22) Filed: Apr. 8, 2022

(65) Prior Publication Data

US 2022/0326329 A1  Oct. 13, 2022

(30) Foreign Application Priority Data

Apr. 9, 2021 (CN) .......................... 202110381732.X

(51) Int. Cl.
| | | |
|---|---|---|
| *G01R 33/56* | (2006.01) | |
| *G01R 33/48* | (2006.01) | |
| *G06T 11/00* | (2006.01) | |
| *G01R 33/565* | (2006.01) | |

(52) U.S. Cl.
CPC ..... *G01R 33/5608* (2013.01); *G01R 33/4824* (2013.01); *G01R 33/56545* (2013.01); *G06T 11/006* (2013.01); *G06T 2211/424* (2013.01)

(58) Field of Classification Search
CPC ........... G01R 33/5608; G01R 33/4824; G01R 33/56545; G06T 11/006; G06T 2211/424
See application file for complete search history.

(56) References Cited

U.S. PATENT DOCUMENTS

2009/0238430 A1* 9/2009 Haider ............... G01R 33/5611
382/131

\* cited by examiner

*Primary Examiner* — G. M. A Hyder
(74) *Attorney, Agent, or Firm* — Banner & Witcoff Ltd.

(57) ABSTRACT

The present disclosure is directed to MRI techniques. The techniques include occupying a central region of a first k-space with full sampling along a Cartesian trajectory, occupying a peripheral region of the first k-space with undersampling along a non-Cartesian trajectory; acquiring sensitivity distribution information of receiving coils; based on a sensitivity distribution chart, merging the Cartesian data of the central region according to multiple channels to obtain a third k-space; based on the sensitivity distribution chart, applying parallel imaging and compressed sensing to the undersampled non-Cartesian trajectory to reconstruct an image, obtaining a second k-space by transformation, and when the second k-space and third k-space are synthesized, using a central region of the second k-space to replace the third k-space of a corresponding region to obtain a k-space suitable for image reconstruction.

15 Claims, 6 Drawing Sheets

MAGNETIC RESONANCE IMAGING METHOD AND MAGNETIC RESONANCE IMAGING SYSTEM

CROSS-REFERENCE TO RELATED APPLICATIONS

The present application claims the benefit of the filing date of China patent application no. CN 202110381732.X, filed on Apr. 9, 2021, the contents of which are incorporated herein by reference in their entirety.

TECHNICAL FIELD

The disclosure relates to the field of medical imaging and, in particular, to a method for performing magnetic resonance image reconstruction based on mixed-trajectory acquired and recorded magnetic resonance signal data, combining parallel imaging and compressed sensing reconstruction.

BACKGROUND

Magnetic resonance imaging (MRI) is a medical imaging technology in which an antenna is used to irradiate an object with RF pulse signals under certain magnetic field conditions, and imaging is performed based on modulated RF signals received from the object. MRI technology can be used to study the internal structure, composition, and physiological processes, etc. of the object. RF pulses with the Larmor frequency cause spin nucleons in the irradiated object, such as hydrogen nuclei (i.e. H+), to precess at an angle of deflection; after excitation, magnetic resonance (MR) RF signals are generated, received via a receiving coil, and processed by a computer to perform imaging.

Existing MR scan protocols based on pulse sequences with ultra-short echo times (TE) have the advantage of ultra-low noise, and can greatly improve comfort for the patient during MR scanning; therefore, the abovementioned MR scan protocols are naturally widely used in pediatric MRI, dental imaging, lung imaging, and conventional organ MR scans and examinations. However, the abovementioned MR scan protocols, e.g. k-space executing a PETRA sequence, have acquired magnetic resonance signal data occupied in a peripheral region of the k-space along a non-Cartesian trajectory such as a 3D radial trajectory through gradient magnetic field control, and occupied and recorded along Cartesian points in a central region of k-space. A high-resolution image is obtained based on the abovementioned MR scan protocols, and the Nyquist criterion must be satisfied; therefore a large number of radial trajectories for example are acquired and a large amount of time is thereby consumed. Thus, there is a need to provide a magnetic resonance scanning technique that is able to satisfy the image quality required for diagnosis and reduce the duration of acquisition.

SUMMARY

In view of the above, one aspect of the present disclosure proposes an MRI method that is at least based on compressed sensing reconstruction, directed at situations involving multiple receiving coils, and also combines and is suitable for parallel imaging to process, for example, problems relating to the reconstruction of a magnetic resonance image of k-space recorded and acquired in mixed trajectories of an undersampled part and obtain an image suitable for medical diagnosis, wherein the undersampled part comprises k-space of a non-Cartesian trajectory, and the method comprises the following steps: magnetic resonance signal data acquired by at least one receiving coil occupying a central region of a first k-space along a Cartesian trajectory under gradient magnetic field control with full sampling, and the acquired magnetic resonance signal data occupying a peripheral region of the first k-space along a non-Cartesian trajectory under gradient magnetic field control with undersampling; reconstructing first image data in order to construct a second k-space, based on extraction of data occupying the non-Cartesian trajectory in the peripheral region of the first k-space, wherein the step of reconstructing first image data at least comprises using a sparse representation of first image data in a transform domain to perform suppression of artifacts caused by the undersampling in the first image data during image reconstruction, and wherein data occupies a Cartesian trajectory in the second k-space obtained by transformation based on the reconstructed first image data; generating a k-space suitable for MRI, based on synthesis of the second k-space with data occupying the Cartesian trajectory in the central region of the first k-space.

Optionally, in the MRI method, the step of generating a k-space suitable for MRI based on synthesis of the second k-space with data occupying the Cartesian trajectory in the central region of the first k-space comprises: generating a k-space suitable for MRI based on extraction of data occupying the Cartesian trajectory in the central region of the first k-space to replace data occupying a Cartesian trajectory in a corresponding central region in the second k-space.

Optionally, the MRI method further comprises: acquiring sensitivity distribution information reflecting multiple receiving coils.

Optionally, in the MRI method, the extraction of data occupying the non-Cartesian trajectory in the peripheral region of the first k-space and reconstruction of first image data in order to construct a second k-space comprises: the step of reconstructing first image data further comprises performing parallel imaging with the aid of the sensitivity distribution information.

Optionally, in the MRI method, the step of reconstructing first image data to construct a second k-space based on extraction of data occupying the non-Cartesian trajectory in the peripheral region of the first k-space comprises: subjecting data occupying the non-Cartesian trajectory peripherally in multiple said first k-spaces to parallel imaging in order to obtain first image data; using a sparse representation of the first image data in a transform domain to perform suppression of artifacts caused by the undersampling in the first image during image reconstruction in order to obtain reconstructed first image data; based on the reconstructed first image data, applying a Fourier transform to obtain the second k-space.

Optionally, in the MRI method, the step of generating a k-space suitable for MRI based on synthesis of the second k-space with data occupying the Cartesian trajectory in the central region of the first k-space comprises: applying the sensitivity distribution information to data occupying the Cartesian trajectory in the central region of multiple said first k-spaces corresponding to the receiving coils, to construct a third k-space.

Optionally, in the MRI method, the step of applying the sensitivity distribution information to data occupying the Cartesian trajectory in the central region of multiple said first k-spaces corresponding to the receiving coils, to construct a third k-space, comprises: based on transformation to an image domain of data of the Cartesian trajectory occupied by the central region of the multiple first k-spaces corresponding to the receiving coils and multiplication with the conjugate of the sensitivity distribution information, and merging according to measurement channels corresponding to the receiving coils, obtaining second image data to construct the third k-space.

Optionally, in the MRI method, the step of applying the sensitivity distribution information to data occupying the Cartesian trajectory in the central region of the first k-spaces to construct a third k-space comprises: extracting data of the occupied Cartesian trajectory in the central region from the first k-spaces, and using zero filling in a region outside the central region with reference to the sensitivity distribution information to obtain multiple Cartesian point sets of the same size as a matrix of the sensitivity distribution information, wherein the multiple Cartesian point sets correspond to acquisition of the receiving coils; applying an inverse Fourier transform to the multiple Cartesian point sets to obtain multiple third image data, and using the conjugate of the sensitivity distribution information for multiplication with the third image data respectively; and merging according to measurement channels corresponding to the receiving coils to obtain second image data; based on the second image data, transforming to the third k-space.

Optionally, in the MRI method, the step of generating a k-space suitable for MRI based on synthesis of the second k-space with data occupying the Cartesian trajectory in the central region of the first k-space further comprises: synthesis of the second k-space and the third k-space to generate a k-space suitable for image reconstruction, wherein data of the Cartesian trajectory occupied by the central region of the second k-space is replaced by data of a Cartesian trajectory occupied by a corresponding region in the third k-space, and wherein a central region of the second k-space has the same size as the central region of the first k-space.

Optionally, in the MRI method, the reconstructed first image data is reconstructed with the aid of compressed sensing.

Optionally, in the MRI method, the non-Cartesian trajectory is a 3D radial trajectory.

Optionally, in the MRI method, the step of acquiring sensitivity distribution information reflecting the receiving coils comprises: applying gridding processing to the first k-space; removing a high-frequency part from the gridded first k-space to extract and generate a low-resolution image; computing the sensitivity distribution information based on the low-resolution image.

Optionally, in the MRI method, ESPIRiT is applied to the low-resolution image to obtain the sensitivity distribution information by computing an eigenvector from a null space.

Another aspect of the present disclosure provides an MRI system, comprising: at least one receiving coil; a magnetic resonance controller; and a memory storing a program, the program comprising instructions, the magnetic resonance controller being connected to the memory and configured to execute the instructions, wherein the instructions, when executed by the magnetic resonance controller, cause the MRI system to perform the MRI method as described above.

Another aspect of the present disclosure provides a computing device, configured to be used for an MRI method using a k-space trajectory in an MRI system comprising at least one receiving coil, the k-space trajectory at least comprising a central region where magnetic resonance signal data acquired by the receiving coil occupies a k-space with full sampling along a Cartesian trajectory and a peripheral region where the acquired magnetic resonance signal data occupies the k-space with undersampling along a non-Cartesian trajectory, the computing device comprising a memory and at least one processor, the memory comprising instructions executed by the at least one processor, and execution of the instructions causing the computing device to perform the MRI method as described above.

Another aspect of the present disclosure provides a computer program product, comprising a program executed by at least one processor of a computing device, the program comprising instructions, wherein execution of the instructions causes the at least one processor to perform the MRI method as described above.

Another aspect of the present disclosure provides a computer-readable storage medium storing a program, the program comprising instructions, wherein the instructions, when executed by an electronic device, cause the electronic device to perform the MRI method as described above.

One advantage of the MRI method provided in the present disclosure is that mixed-trajectory k-space comprises magnetic resonance signal data recorded by an undersampled non-Cartesian trajectory and magnetic resonance signal data acquired along a Cartesian trajectory; consideration is given to at least the application of compressed sensing to a portion of data acquired by the undersampled non-Cartesian trajectory to reconstruct an image and the possibility of transforming this portion to reconstructed k-space in which data is recorded in a Cartesian trajectory, a central region of mixed-trajectory k-space can thereby be synthesized with the reconstructed k-space, and an image with a resolution suitable for a medical diagnosis standard can be obtained based on the synthesized k-space; and the method utilizes the advantage that the duration of MRI signal acquisition of the undersampled non-Cartesian trajectory is short.

Another advantage is that for mixed-trajectory k-space acquired by multiple coils; consideration is given to the combined application of parallel imaging and compressed sensing reconstruction to a portion of data acquired by the undersampled non-Cartesian trajectory in order to obtain an image with a resolution suitable for a medical diagnosis standard, and parallel imaging can further improve the advantage of the short duration of MRI signal acquisition.

Another advantage is that, with regard to the fact that parallel imaging and compressed sensing reconstruction cannot be applied directly to data of k-space acquired in mixed trajectories, the present disclosure proposes separate processing of (magnetic resonance signal) data acquired in a Cartesian trajectory and data acquired in a non-Cartesian trajectory in k-space acquired in mixed trajectories, thereby solving the abovementioned problem. Moreover, a technical solution is proposed in which coil sensitivity distribution information is used for separate application to the merging of data of the Cartesian trajectory of the central region of the k-space according to channels and subjecting data of the non-Cartesian trajectory of the peripheral region to parallel imaging.

Another advantage is that consideration is given to obtaining an improved third k-space from a fully acquired Cartesian trajectory portion in combination with sensitivity distribution information relating to the receiving coils in the mixed-trajectory k-space, and data acquired on the basis of a non-Cartesian trajectory in a peripheral region undergoes parallel imaging and compressed sensing reconstruction, then a Fourier transform is applied to obtain a second k-space; data of the second k-space is recorded in a Cartesian trajectory, such that the second k-space and the third k-space can be suitable for synthesis processing, and a central region of the third k-space replaces a corresponding region of the second k-space in order to obtain a k-space suitable for image reconstruction, further improving the final MRI imaging quality and image resolution on the basis of magnetic resonance signal acquisition with a shorter duration.

Another advantage is that by using the MRI method provided in the present disclosure, while retaining the advantage of ultra-low noise of existing MR scan protocols based on pulse sequences with ultra-short echo times (TE), such as the PETRA sequence, etc., and the advantage of being able to vastly improve patient comfort during MR scanning, it is also possible to utilize the advantage of the MRI signal acquisition duration being reduced by the undersampled non-Cartesian trajectory therein so that the MR scan protocol based on mixed MRI signal acquisition trajectories is used more widely.

The utilization of sensitivity distribution information and compressed sensing to perform reconstruction for k-space with mixed MR trajectories comprising an undersampled part is realized to improve the k-space and to obtain an image suitable for medical diagnosis.

BRIEF DESCRIPTION OF THE DRAWINGS/FIGURES

Embodiments of the present disclosure are described in detail below with reference to the accompanying drawings, to give those skilled in the art a clearer understanding of the abovementioned and other features and advantages of the present disclosure. In the drawings.

Figure 1:
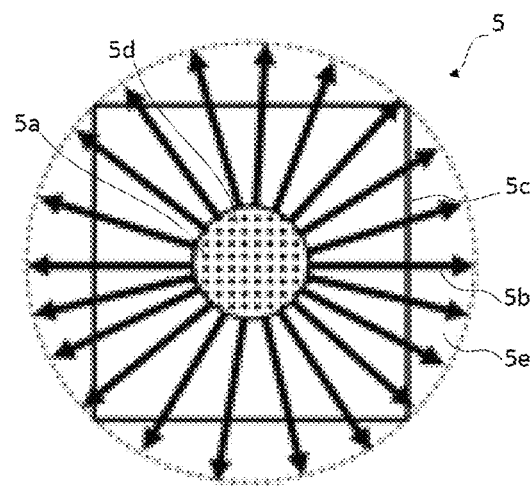
FIG. 1 shows an example schematic drawing of k-space obtained on the basis of execution of a PETRA pulse sequence.

KEY TO THE FIGURES 1 magnetic resonance imaging system
2 examination region
3 receiving coil
4 bed body
5 first k-space
5a Cartesian trajectory
5b radial trajectory
5c field of view
5d central region
5e peripheral region
6 gradient coil
7 RF coil
10 magnet
11 magnetic resonance controller
12 gradient controller
13 RF controller
14 recording unit
15 memory
16 computing unit
17 input unit
18 display
P examination object

DETAILED DESCRIPTION

To enable a clearer understanding of the technical features, objectives, and effects of the present disclosure, particular embodiments of the present disclosure are now explained with reference to the accompanying drawings, in which identical labels indicate identical parts.

Pointwise Encoding Time Reduction with Radial Acquisition (PETRA) is a type of pulse sequence based on ultra-short echo time (TE), having a 3D radial acquisition trajectory and Cartesian single-point features at the center of k-space. The PETRA pulse sequence has the advantage of ultra-low noise, being able to improve patient comfort during MRI image acquisition, and is widely used in the field of pediatric MRI in particular. However, when the PETRA pulse sequence is executed, a long time is required (generally more than 6 minutes) to produce an image with high resolution, because the PETRA pulse sequence needs to sample a large number of radial angles of view.

In parallel imaging (also called parallel acquisition), MR signal data is acquired from multiple receiving coils simultaneously, thereby reducing k-space data sampling, accelerating scanning, and maintaining spatial resolution. Each coil exhibits different spatial sensitivity information (profile), serving an additional spatial encoding function. Acquisition is accelerated by undersampling k-space and using sensitivity information for image reconstruction. Here, there are two main technical paths: SENSE (SENSitivity Encoding), based on explicit coil sensitivity; and GRAPPA (GeneRalized Autocalibrating Partial Parallel Acquisition), based on the use of known relevance in k-space. ESPIRiT (Iterative self-consistent parallel imaging reconstruction using eigenvector maps) is an eigenvector-based autocalibration technique, which combines the advantages of SENSE and robustness for specific errors similar to GRAPPA.

Compressed Sensing is a technique that uses sparsity signals to restore highly undersampled data, suppressing artifacts caused by undersampling in MR images through sparse representation or sparsity of MR image data in a transform domain. The image reconstruction based on compressed sensing is generally based on solving an undetermined linear system.

Based on the consideration of the factors mentioned above, the present disclosure provides an accelerated imaging technique based on non-Cartesian parallel imaging and compressed sensing. The two techniques mentioned above use different prior information, and can therefore be combined to obtain a higher acceleration factor, called PICS (Parallel imaging and Compressed sensing).

FIG. 1 shows an example schematic drawing of k-space obtained on the basis of execution of a PETRA pulse sequence.

Referring to FIG. 1, a first k-space 5 acquired on the basis of execution of the PETRA pulse sequence consists of two parts, comprising: radial acquisition spokes of a peripheral region 5e covering most of the region outside a central region 5d in 3D k-space, i.e. radial trajectories 5b as non-Cartesian trajectories, and multiple Cartesian acquisition single points in a sphere covering the central region 5d of 3D k-space, or a Cartesian trajectory 5a. When obtaining the Cartesian acquisition single points or Cartesian trajectory 5a, the sphere of the central region 5d of the first k-space 5 is covered by Pointwise Encoding (PE), and this region is generally a part that is likely to be missing when non-Cartesian trajectory acquisition is performed. When obtaining MR signals acquired by recording along the radial trajectories 5b, when acquisition is performed along one radial spoke, a gradient magnetic field is controlled so as to be set to be constant in nearly the whole of the repetition sequence, and the gradient magnetic field is changed slightly only at the end of each repetition sequence. A large number of spokes need to be acquired to complete full sampling along the radial trajectories 5b or non-Cartesian trajectories; generally, full acquisition requires the acquisition of about 50,000 radial trajectories or spokes to meet the image resolution requirements or medical diagnosis requirements. As a result, a large amount of time is needed to obtain a mixed-trajectory k-space of fully sampled radial trajectories 5b, but the number of points acquired in the central region 5d acquired along the Cartesian trajectory 5a to satisfy image resolution is small.

It must be explained that FIG. 1 shows a 2D projection of acquisition trajectories for obtaining the first k-space 5 based on execution of the PETRA pulse sequence, wherein the circle of dots represents k-space acquired along the Cartesian trajectory 5a, and the solid box represents a reconstructed Field of View (FoV) 5c. The acquisition of the radial trajectories 5b occupies most of the scanning time; if the number of acquisitions associated with the radial trajectories 5b could be reduced, scanning time could be saved. However, according to the Nyquist criterion, undersampling for the radial trajectories 5b will lead to image artifacts.

Figure 2:
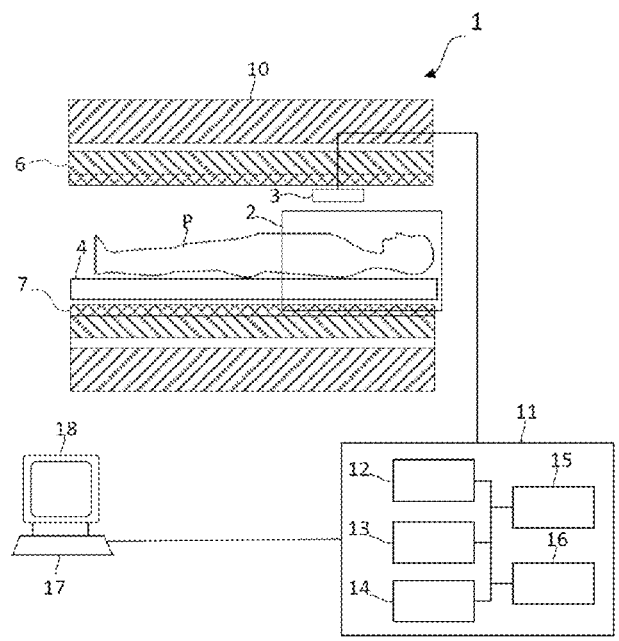
FIG. 2 shows an example schematic diagram of an MRI system comprising a receiving coil according to an exemplary embodiment.

FIG. 2 shows an example schematic diagram of an MRI system comprising a receiving coil according to an exemplary embodiment.

Referring to FIG. 2, a magnetic resonance (MR) system 1 is described; using the MRI system 1, it is possible to perform an improved method for generating an MR image of an examination object P. The examination object P may be placed in an examination bore in an examination region 2 of the MRI system 1. The MRI system 1 comprises a magnet 10 for generating a basic field BO. At the center of the magnet 10, the examination object P is moved into the examination region 2 such that the MRI system 1 receives spatially-encoded MR signals from the examination region 2, and the MR signals are acquired by at least one receiving coil 3. Through the emission of a radio frequency (RF) pulse sequence by an RF coil 7 and the switching of a gradient magnetic field provided by a gradient coil 6 for example, nuclear spins in the examination region 2 can be deflected from an equilibrium position, and spin echoes and stimulated echo signals can be generated in the examination object P. Currents caused by spin echoes and stimulated echo signals generated by the basic field BO and returning to the equilibrium position can be converted in the receiving coil 3 to MR signals for generating MR measurement data. MR measurement signals detected by each receiving coil 3 are associated with a corresponding MR measurement channel. The general operating modes used to generate MR images and detect MR signals are not further described here.

The MR system 1 comprises an MR controller 11 used to control the MR system 1. The MR controller is adapted to perform the improved MRI method according to the present disclosure, and the MR controller 11 further comprises a gradient controller 12 and an RF controller 13, wherein the gradient controller 12 is used to control and switch gradient magnetic fields, and the RF controller 13 is used to control and emit RF pulses for deflecting nuclear spins from the equilibrium position. In a memory 15, for example, it is possible to store and record imaging sequences or pulse sequences needed to acquire MR images, and programs needed for operations of the MR system 1. A recording unit 14 controls image recording, thereby controlling gradient magnetic fields and RF sequences as well as MR measurement signal reception intervals as a function of determined imaging sequences. The recording unit 14 also controls the gradient controller 12 and the RF controller 13. MR images able to be displayed on a display 18 can be computed in a computing unit 16, wherein an operator operates the MRI system 1 via an input unit 17. The memory 15 may have an imaging sequence (or pulse sequence) and a program module; when instructions included in one of the program modules are executed in the computing unit 16, the imaging sequence and the instructions included in the program perform the MRI method according to the present disclosure. An MRI imaging method is explained below with reference to the drawings; the MRI imaging method is adapted to perform MRI imaging of k-space acquired in mixed trajectories, wherein the k-space acquired in mixed trajectories can have the acquired MR signals occupy a central region of k-space with full acquisition along a Cartesian trajectory, and occupy a peripheral region of the k-space with under-acquisition along a non-Cartesian trajectory. When using the MRI imaging method, it is possible to obtain image resolution adapted to medical diagnosis while reducing the time taken to acquire the MR signals.

Figure 3:
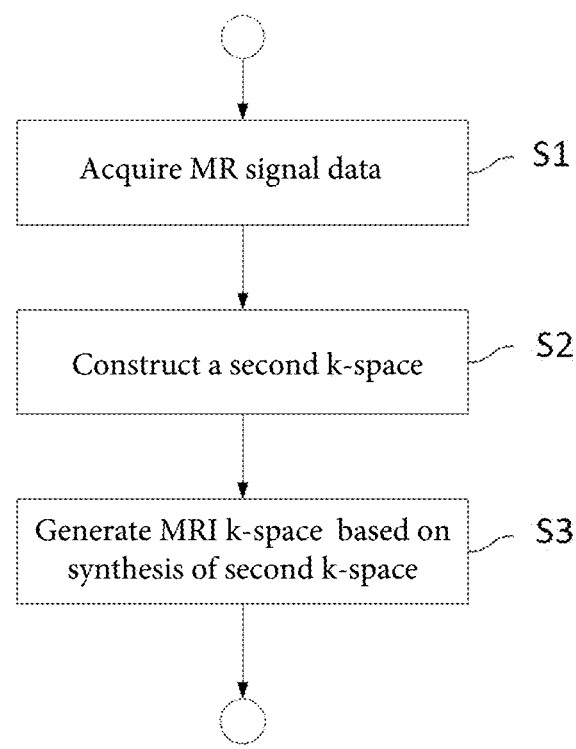
FIG. 3 shows an example flow chart of steps of an MRI method applied to an examination object and performed in an MRI system comprising at least one receiving coil according to an embodiment of the present disclosure.

FIG. 3 shows an example flow chart of steps of an MRI method applied to an examination object and performed in an MRI system comprising at least one receiving coil according to an embodiment of the present disclosure.

Referring to FIG. 3, in step S1, MR signal data acquired by the at least one receiving coil 3 occupies the central region 5d of the first k-space 5 along the Cartesian trajectory 5a under gradient magnetic field control with full sampling, and acquired MR signal data occupies the peripheral region 5e of the first k-space 5 along the non-Cartesian trajectory under gradient magnetic field control with undersampling.

Taking as an example the execution of the PETRA sequence and the recording of MR signal data acquired from the receiving coil 3 according to a PETRA acquisition trajectory, under gradient magnetic field control, the central region 5d of the first k-space 5 is occupied pointwise with the acquired MR signal data along the Cartesian trajectory 5a, the central region 5d being spherical; and under gradient magnetic field control, the peripheral region 5e of the first k-space 5 is occupied with acquired MR signal data along the 3D radial trajectories 5b (or radiating trajectories—spokes), thereby obtaining the first k-space 5 based on PETRA acquisition trajectories. In addition, non-Cartesian trajectory sampling occupying the peripheral region 5e of the first k-space 5 may also be a spiral trajectory, etc.

In step S2, based on extraction of data occupying the non-Cartesian trajectories 5b in the peripheral region 5e of the first k-space 5, a second k-space is constructed by reconstructing first image data, wherein reconstructing the first image data at least comprises using a sparse representation of the first image data in a transform domain to perform suppression of artifacts caused by the undersampling in the first image data during image reconstruction, and wherein data occupies a Cartesian trajectory in the second k-space obtained by transformation based on the reconstructed first image data. Here, the reconstructed first image data may obtain the second k-space under a Fourier transform or fast Fourier transform, and data thereof is recorded in the second k-space by occupying a Cartesian trajectory.

In the reconstruction of first image data, first of all, for example by means of an inverse Fourier transform, the extracted data occupying the non-Cartesian trajectories 5b in the peripheral region 5e of the first k-space 5 is transformed to the image domain to obtain first image data, then a filter transform is applied to the first image data and the transformation thereof into a sparse representation transform domain is performed, and artifacts introduced due to undersampling in the first image data (the non-Cartesian trajectory part) are suppressed during image reconstruction. For this purpose, when performing image reconstruction of the first image data, it is necessary to obtain a solution satisfying a constraint condition, for example such that the first image data under the action of the filter transform is minimized under the norm $l_1$, and such that a regularization constraint is satisfied between measured k-space and k-space under the Fourier transform in the process of reconstructing the first image data, e.g. is a minimum under the norm $l_2$. Here, the reconstructed first image data is reconstructed with the aid of compressed sensing, i.e. with the aid of compressed sensing, the sparse representation of the first image data in the transform domain is used to perform suppression of artifacts caused by undersampling in a first image during image reconstruction, and the second k-space can be obtained by applying a Fourier transform to the reconstructed first image data; here, compressed sensing reconstruction can be suitable for iteration.

In step S3, based on synthesis of the second k-space with data occupying the Cartesian trajectory 5a in the central region 5d of the first k-space 5, a k-space suitable for MRI is generated. Specifically, based on extraction of data occupying the Cartesian trajectory 5a in the central region 5d of the first k-space 5 to replace data occupying the Cartesian trajectory in the corresponding central region in the second k-space, the k-space suitable for MRI can be generated.

The present disclosure also provides an MRI method, which can be suitable for mixed-trajectory k-space acquired by multiple receiving coils 3. For sampling multiple receiving coils 3, it is possible to use the acquisition of sensitivity distribution information reflecting the receiving coils; with the aid of parallel imaging, it is possible to further reduce the MRI signal acquisition duration, and it is also possible to subject the mixed-trajectory k-space to respective processing according to the region where each different acquisition trajectory is located, in order to further improve it so as to obtain the k-space suitable for MRI.

Figure 4:
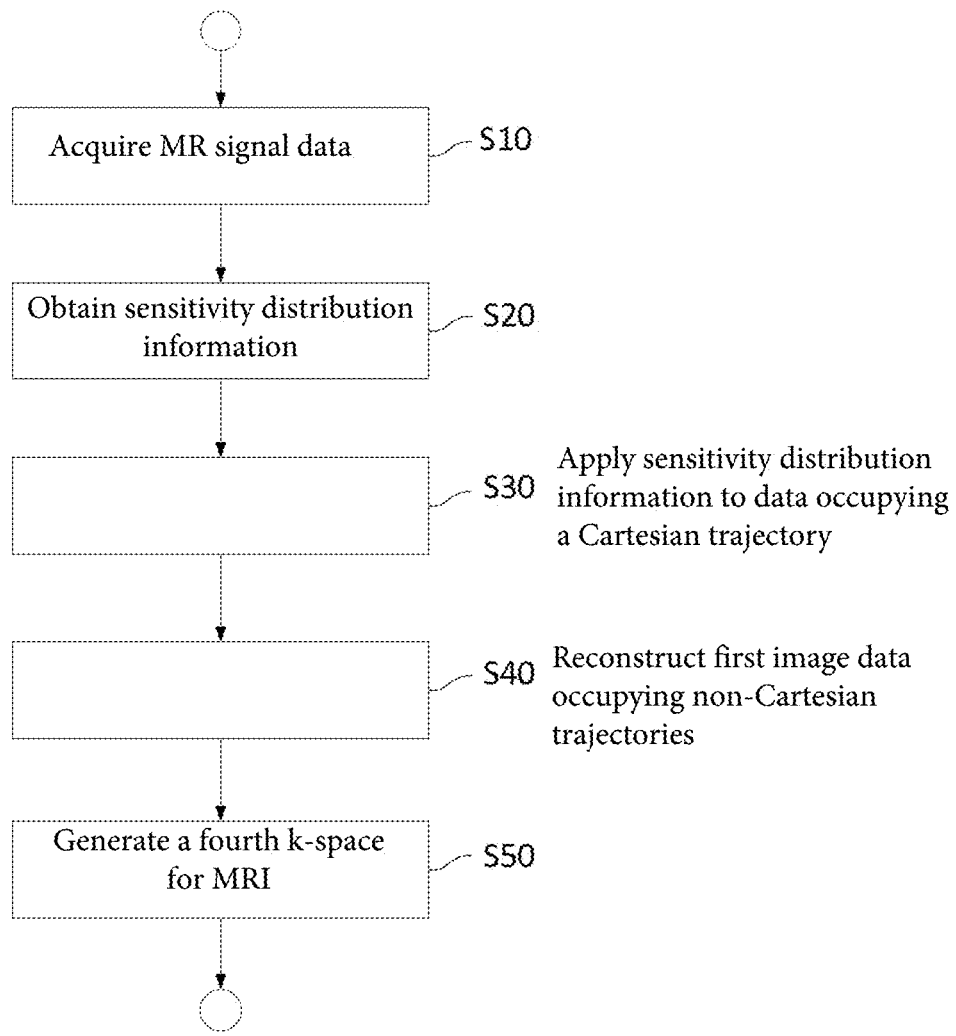
FIG. 4 shows an example a flow chart of steps of an MRI method applied to an examination object and performed in an MRI system comprising multiple receiving coils according to an embodiment of the present disclosure.

FIG. 4 shows an example flow chart of steps of an MRI method applied to an examination object and performed in an MRI system comprising multiple receiving coils according to an embodiment of the present disclosure.

Referring to FIG. 4, in step S10, MR signal data acquired by multiple receiving coils occupies the central region 5d of the first k-space 5 along the Cartesian trajectory 5a under gradient magnetic field control with full sampling, and acquired MR signal data occupies the peripheral region 5e of the first k-space 5 along the non-Cartesian trajectory under gradient magnetic field control with undersampling. Here, MR signal data is acquired by means of the multiple receiving coils 3 and corresponding measurement channels, and separately recorded in multiple first k-spaces 5 in the manner described above.

Here, the multiple receiving coils 3 can use parallel acquisition (parallel sampling) for the acquired MR signal data.

In step S20, based on the first k-space 5, sensitivity distribution information reflecting the multiple receiving coils 3 is obtained. Here, the sensitivity distribution information can provide phase or spatial position correction encoding for parallel imaging, and it is thereby possible to subsequently optimize the first k-space 5 or provide a coil image to facilitate parallel imaging.

Here, the sensitivity distribution information of the receiving coils 3 may be calculated with the aid of a method such as SENSE, GRAPPA, SMASH, AUTO-SMASH or SPIRiT.

In step S30, based on the sensitivity distribution information, the sensitivity distribution information is applied to data occupying the Cartesian trajectory 5a in the central region 5d of the first k-space 5 to construct a third k-space.

Here, based on transformation to the image domain of data of the Cartesian trajectory 5a occupied by the central region 5d of the multiple first k-spaces 5 corresponding to the receiving coils 3, multiplication with the conjugate of the sensitivity distribution information and merging according to the measurement channels corresponding to the receiving coils 5, second image data is obtained in order to construct the third k-space.

Specifically, interpolation, for example zero filling, may be applied to a region outside the data occupying the Cartesian trajectory 5a in the central region 5d, to obtain a Cartesian trajectory set of the same size as a matrix of sensitivity distribution information; then, for example, the transformation of the Cartesian trajectory set to the image domain is used for the purpose of multiplication with the conjugate of the sensitivity distribution information for the subsequent purpose of image data merged according to measurement channels; and then the third k-space is constructed by applying a Fourier transform or fast Fourier transform to the merged image data.

In step S40, based on the sensitivity distribution information, first image data is reconstructed for data occupying the non-Cartesian trajectories in the peripheral region 5e of the first k-space 5 in order to construct a second k-space, wherein reconstructing the first image data comprises performing parallel imaging with the aid of the sensitivity distribution information and using sparsity or a sparse representation of the first image data in a transform domain to perform suppression of artifacts caused by undersampling in the first image data during image reconstruction in order to obtain reconstructed first image data, and wherein data occupies a Cartesian trajectory in the second k-space and is recorded.

In one embodiment which is shown, in the application of parallel imaging with the aid of the sensitivity distribution information to data occupying the non-Cartesian trajectories, e.g. the radial trajectories 5b, in the peripheral region 5e of the first k-space 5 to obtain first image data, for example, first of all, data of the non-Cartesian trajectories occupied in the peripheral region 5e is extracted from the multiple first k-spaces 5 corresponding to the receiving coils 3, gridding is first applied to the multiple data occupying the non-Cartesian trajectories, then an inverse Fourier transform is used for transformation to the image domain, in which it is possible to separately apply multiplication with multiple sensitivity distribution information conjugate matrices to obtain first image data by merging, and in this parallel imaging, there is applicability to iteration so that the obtained first image data satisfies a convergence condition; then, in reconstruction of the first image data, the transformation thereof into a sparse representation transform domain is performed for example by means of a filter transform, and artifacts introduced due to undersampling in the first image data are suppressed during reconstruction, for which purpose, a solution satisfying a constraint condition must be obtained when subjecting the first image data to image reconstruction, for example such that the first image data under the action of the filter transform is minimized under the norm $l_1$, and such that a regularization constraint is satisfied between measured k-space and k-space under the Fourier transform in the process of reconstructing the first image data, e.g. is a minimum under the norm $l_2$. Here, the reconstructed first image data is reconstructed with the aid of compressed sensing, and the compressed sensing reconstruction is also suitable for iteration.

In addition, when the extracted data occupying the non-Cartesian trajectories, e.g. the radial trajectories $5b$, in the peripheral region $5e$ of the first k-space 5 is transformed to the sparse representation transform domain, the filter transform or non-linear filter transform (e.g. linear operator or non-linear operator) applied may for example use a sparse transform such as a small-wave transform, a discrete small-wave transform, a discrete cosine transform or a finite difference transform.

In addition, in the process of using compressed sensing reconstruction to obtain image data, coil sensitivity distribution information may be added in the optimization problem as a weight.

In addition, it is also possible to use for example deep learning or a neural network to reconstruct the first image data. In addition, in the reconstruction of first image data by parallel imaging, the restriction of data occupying the non-Cartesian trajectories to a regular k-space grid may not be limited to the application of gridding or re-gridding, or it is also possible to apply a non-uniform inverse Fourier transform (IFFT).

Here, second image data can be obtained in response to the application of sensitivity distribution information to data occupying the Cartesian trajectory in the central region $5d$ of the first k-space 5 and merging according to the measurement channels corresponding to the receiving coils, and a transformation to the third k-space is performed based on the second image data; based on sensitivity distribution information, parallel imaging is applied to data occupying the non-Cartesian trajectories in the peripheral region $5e$ of the first k-space 5 to obtain the first image data, and then the first image data is reconstructed, in order to perform a transformation to the second k-space based on the first image data.

In step S50, based on synthesis of the third k-space and the second k-space, a fourth k-space suitable for MRI is generated. In the process of generating the fourth k-space, data of the Cartesian trajectory occupied by the central region of the second k-space is replaced by data of the Cartesian trajectory occupied by the corresponding region in the third k-space, wherein the central region of the second k-space has the same size as the central region $5d$ of the first k-space 5.

Figure 5:
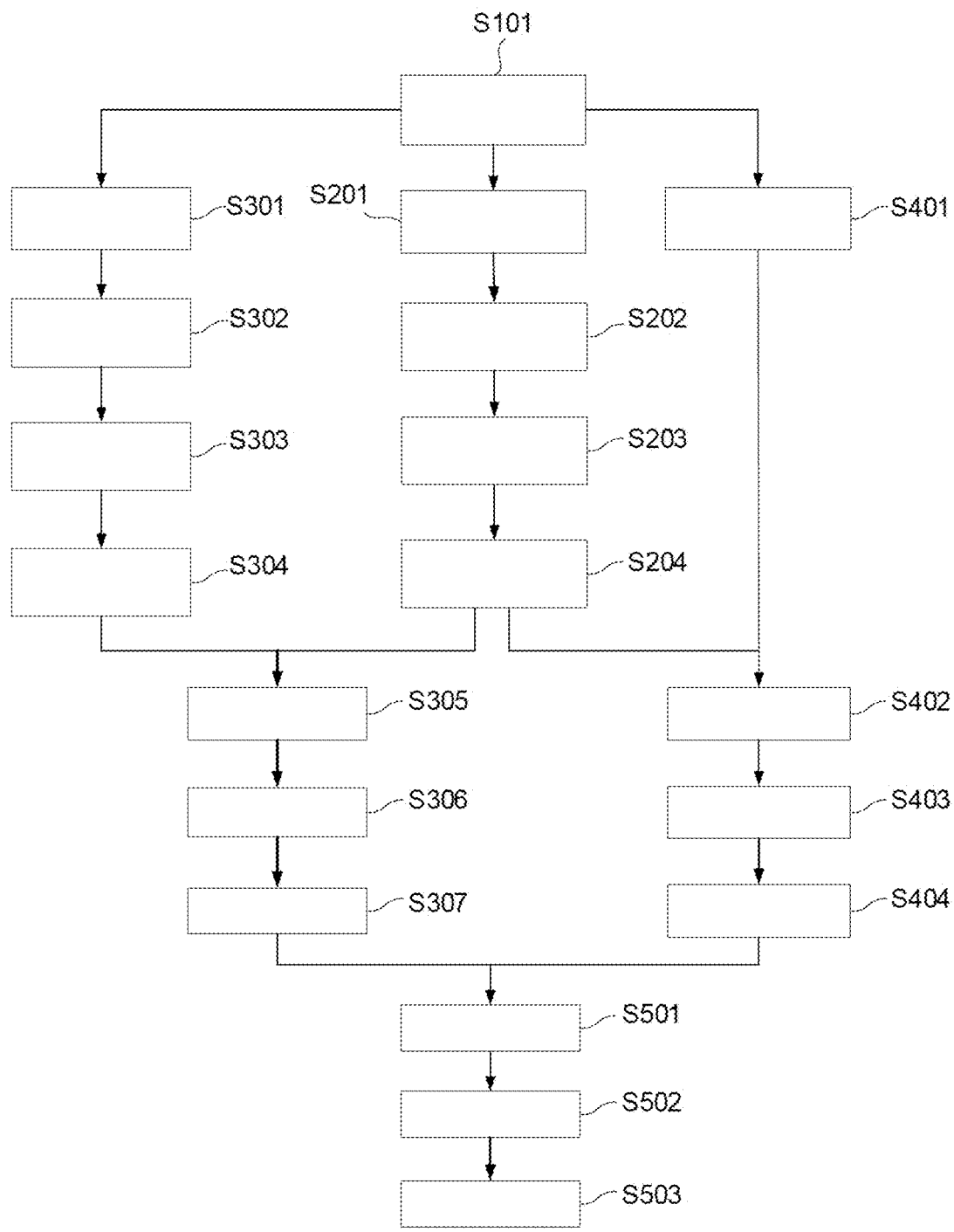
FIG. 5 shows an example a flow chart of steps of another MRI method applied to an examination object and performed in an MRI system comprising multiple receiving coils according to another embodiment of the present disclosure.

FIG. 5 shows an example flow chart of steps of another MRI method applied to an examination object and performed in an MRI system comprising multiple receiving coils according to another embodiment of the present disclosure.

Referring to FIG. 5, in a sampling stage S100 of the method, acquired MR signal data is recorded into corresponding mixed-trajectory k-space of a Cartesian trajectory and a non-Cartesian trajectory according to a gradient magnetic field, wherein data recorded to the Cartesian trajectory is fully sampled, and data recorded to the non-Cartesian trajectory may be irregularly undersampled, undersampled, or randomly undersampled. Step S101 in the sampling stage S100 is like step S10 described above, and is not described again here.

In a stage S200 of the method, in which a sensitivity distribution chart for multiple receiving coils is acquired, the following steps may be included:

In step S201, gridding processing is applied to a first k-space 5. Here, for example, grid kernel function convolution is applied to the first k-space to achieve gridding of the first k-space 5. The gridding method is used to subject the acquired data of the first k-space to weighting according to acquisition density and convolution with a finite kernel function, then re-sampling is performed according to the grid, such that the original acquired data or under the gridding prepares to use a fast Fourier transform (FFT—Fast Fourier Transformation) for transformation into the image domain with a regular k-space grid. In addition, the first k-space 5 may also be transformed to the image domain directly with the aid of a non-uniform inverse Fourier transform.

In step S202, a high-frequency part is removed from the gridded first k-space 5, to extract and generate a low-resolution image. Here, for example, information of a low-frequency part of a representative image of a central region of the first k-space is extracted by removing a high-frequency part in the gridded first k-space 5, and after zero filling of the high-frequency part, it is possible to apply an inverse Fourier transform or a fast inverse Fourier transform to obtain a low-resolution image.

In step S203, based on the low-resolution image, ESPIRiT is applied to calculate a sensitivity distribution chart. Here, ESPIRiT is applied to the low-resolution image to calculate the sensitivity distribution chart. ESPIRiT can obtain the sensitivity distribution chart through calculation of an eigenvector or eigenvector resolution of a null space involved in parallel imaging.

In step S204, the sensitivity distribution chart is obtained. The sensitivity distribution chart records sensitivity distribution information of the receiving coil 3.

In a stage S300 of the method, in which a third k-space is constructed based on the sensitivity distribution chart, synthesis with a second k-space is used to obtain a k-space suitable for MRI, and this comprises the following steps:

In step S301, a first Cartesian point set, i.e. a k-space set, represented by data of a Cartesian trajectory $5a$ occupied in a central region $5d$, is extracted from the first k-space 5.

In step S302, based on a region outside each first Cartesian point set, zero padding (or zero filling) is applied to obtain a second Cartesian point set of the same size as the sensitivity distribution chart (or matrix of sensitivity distribution information).

In step S303, an inverse Fourier transform is separately applied to multiple second Cartesian point sets. Here, each second Cartesian point set corresponds to a corresponding receiving coil 3. In addition, to accelerate the transformation of the second Cartesian point set from k-space to the image domain, an inverse fast Fourier transform (Inverse FFT/iFFT) is generally applied.

In step S304, third image data corresponding to multiple receiving coils 3 is obtained. Here, the third image data reflects position and/or phase encoding of a multi-coil image.

In step S305, the conjugate of the sensitivity distribution chart is used for multiplication with the abovementioned third image data respectively, and merging is performed based on corresponding measurement channels to obtain second image data.

Here, when the conjugate of the sensitivity distribution chart is used for multiplication with the abovementioned image data respectively, this can be expressed as follows:

$$\Sigma_{Coil} IS^* \quad \text{Eqn. 1}$$

wherein, in Eqn. 1, I represents the third image data, $S^*$ represents the conjugate of the sensitivity distribution chart, and the sum based on "Coil" represents the merging of the products of the conjugates of the sensitivity distribution charts with the corresponding third image data according to the measurement channels corresponding to the receiving coils 3 in order to obtain the second image data.

In step S306, a fast Fourier transform (FFT) is applied to the second image data.

It should be noted that in the process of constructing the third k-space, no restrictions are placed on the sequence of using the sensitivity distribution chart for optimization of k-space represented as the second Cartesian point set in order to provide the sensitivity distribution chart of the receiving coil; for example, it is also possible to first apply convolution to the transform domain of the sensitivity distribution chart and the second Cartesian point set and perform transformation to the image domain, and then obtain second image data by merging according to measurement channels; and then apply a Fourier transform to the second image data to obtain the third k-space. This embodiment does not restrict the abovementioned sequence.

In step S307, the third k-space is obtained, and marked as $k_{Cartesian}$.

In a stage S400 of the method, in which a first data image is reconstructed, the sensitivity distribution chart is used to construct the second k-space through parallel imaging and compressed sensing reconstruction, and in the second k-space, data is recorded to occupy a Cartesian trajectory in order to perform synthesis with the third k-space in order to obtain k-space suitable for MRI, and this comprises the following steps:

In step S401, data of a non-Cartesian trajectory occupied in a peripheral region 5e is extracted from the first k-space 5. Here, taking PETRA original data as an example, the non-Cartesian trajectory is a 3D radial trajectory 5b.

In step S402, based on the sensitivity distribution chart, parallel imaging is applied to data of the first k-space 5 of the occupied non-Cartesian trajectory part to obtain first image data, and the first image data is reconstructed with the aid of compressed sensing.

Here, for example, after subjecting data of the first k-space of the occupied non-Cartesian trajectory part to multiplication with the conjugate of the sensitivity distribution chart after transformation to the image domain, first image data is obtained with the aid of parallel imaging, compressed sensing is then applied thereto to reconstruct the first image data. When using compressed sensing for reconstruction, for example when the first image data is transformed to a sparse representation transform domain under the execution of a filter transform, a constraint condition satisfying regularization and minimization under the norm $l_1$ is executed in order to use the sparsity or sparse representation of the first image data in the transform domain to suppress artifacts introduced due to undersampling along the non-Cartesian trajectory in the first image data in image reconstruction. The compressed sensing reconstruction described above is suitable for iteration, and final reconstructed first image data can be obtained after multiple iterations.

In step S403, a fast Fourier transform (FFT) is applied to the reconstructed first image data.

In step S405, the second k-space is obtained, and marked as $k_{Radial}$. In the second k-space, data occupying a Cartesian trajectory is recorded.

In a synthesis stage S500 of the method, the following steps are included:

In step S501, based on synthesis of the third k-space $k_{Cartesian}$ and the second k-space $k_{Radial}$, a fourth k-space suitable for MRI is generated; when the third space $k_{Cartesian}$ and the second space kRadial are synthesized, data occupying a Cartesian trajectory in a central region of the second k-space kRadial is replaced by data occupying a Cartesian trajectory in a corresponding region in the third space $k_{Cartesian}$, and the size of the central region of the second k-space kRadial may be the same as that of the central region 5d of the first k-space 5.

In step S502, an inverse fast Fourier transform (iFFT—Inverse FFT) is applied to the fourth k-space.

In step S503, a final MR image is obtained.

Figure 6:
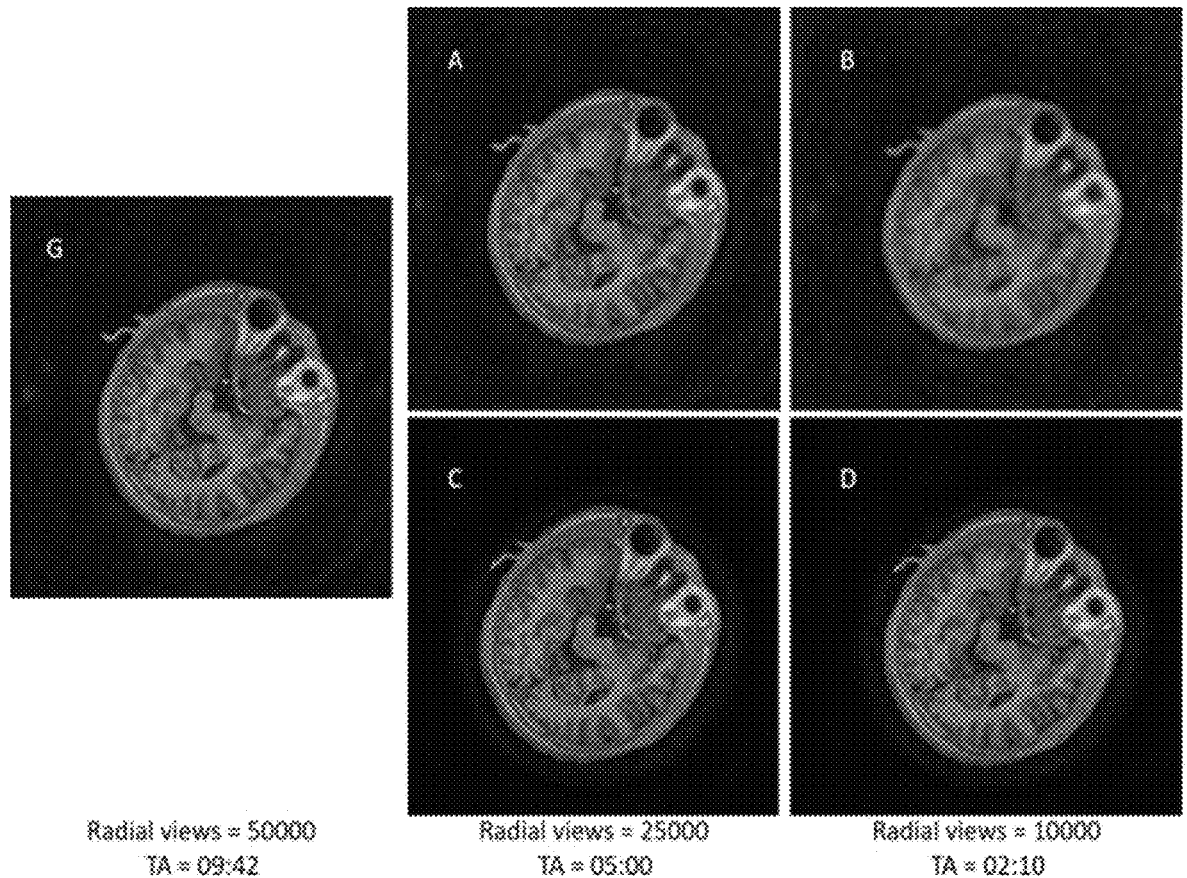
FIG. 6 shows an example comparative figure of image reconstruction based on a standard and image reconstruction of an MRI method performed according to an embodiment of the present disclosure, applied to a mixed-trajectory sequence.

FIG. 6 shows an example comparative figure of image reconstruction based on a standard and image reconstruction of an MRI method performed according to an embodiment of the present disclosure, applied to a mixed-trajectory sequence.

Referring to FIG. 6, FIGS. 5A and B are images having mixed-trajectory k-spaces (additionally comprising a fully acquired Cartesian trajectory in a central region) and obtained by applying a standard non-homogeneous fast Fourier reconstruction method, obtained by a PETRA sequence that has acquired radial trajectories with 25000 spokes and 10000 spokes respectively; it must be explained that radial trajectories of a peripheral region of the k-space are highly undersampled and sparse, and the times taken are 5 minutes and 2:10 minutes respectively. FIGS. 6C and D are final images obtained by performing image reconstruction of a k-space obtained by a PETRA sequence that has acquired radial trajectories with 25000 spokes and 10000 spokes, respectively, and a k-space obtained by performing the MRI method provided in the present disclosure, i.e. the method based on improved parallel imaging and compressed sensing. FIG. 6G is a k-space obtained by a PETRA sequence that has acquired radial trajectories with 50000 spokes; the radial trajectories thereof are fully acquired, the resolution is 256*256*256, and the time taken is about 9:42 minutes. The conclusion drawn by comparison is that: when the acceleration factor is 2 (i.e. radial trajectories with 25000 spokes are acquired), the quality of the image obtained based on the MRI method provided in the present disclosure is very close to that of a fully acquired image; when the acceleration factor is 5 (i.e. radial trajectories with 10000 spokes are acquired), the quality of the image obtained by the MRI method provided in the present disclosure is acceptable for clinical diagnosis and has high image resolution, and the image quality is superior to the quality of reconstruction of an image obtained by adopting standard, non-homogeneous fast Fourier (i.e. FIG. 6C).

Another aspect of the present disclosure provides a computer program product, comprising a program executed by at least one processor of a computing device, the program comprising instructions, wherein the execution of the instructions causes the at least one processor to perform the MRI method as described above.

Another aspect of the present disclosure provides a computer-readable storage medium storing a program, the program comprising instructions which, when executed by an electronic device, cause the electronic device to perform the MRI method as described above.

Figure 7:
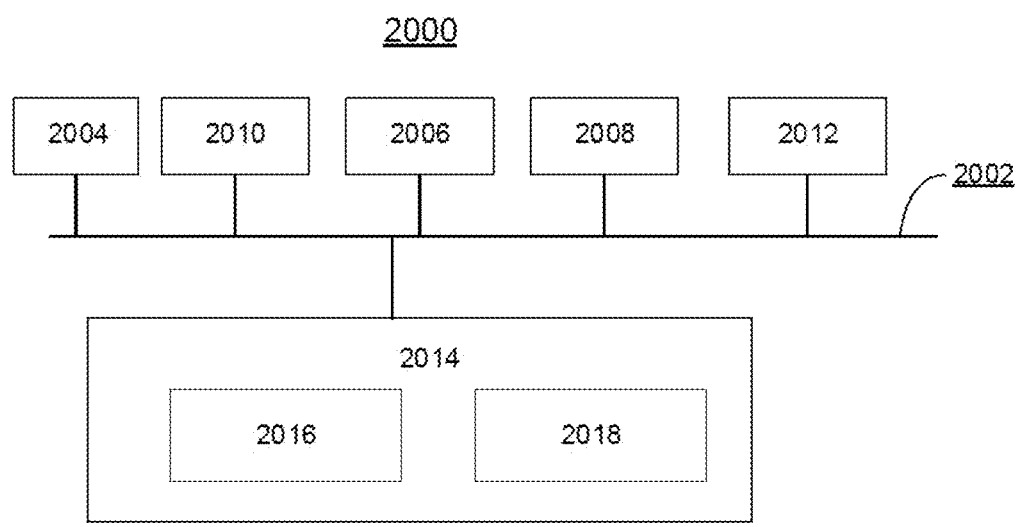
FIG. 7 shows an example structural diagram in accordance with a computing device capable of being applied to an exemplary embodiment.

FIG. 7 shows an example structural diagram in accordance with a computing device capable of being applied to an exemplary embodiment.

Referring to FIG. 7, a computing device 2000 will now be described; this is an example of an electronic device that can be applied to each aspect of the present disclosure. The computing device 2000 may be any machine configured to perform processing and/or computation, and may be, but is not limited to, a workstation, a server, a desktop computer, a laptop computer, a tablet computer, a personal digital assistant, a robot, a smart phone, an on-board computer, or any combination thereof. The abovementioned medical imaging method for detection movement may be completely or at least partially realized by the computing device 2000 or a similar device or system.

The computing device 2000 may comprise (possibly via one or more interfaces) elements connected to a bus 2002 or in communication with the bus 2002. For example, the computing device 2000 may comprise the bus 2002, one or more processor 2004, one or more input device 2006 and one or more output device 2008. The one or more processor 2004 may be any type of processor, and may include, but is not limited to, one or more general-purpose processor and/or one or more dedicated processor (e.g. special processing chip). The input device 2006 may be any type of device capable of inputting information to the computing device 2000, and may include, but is not limited to, a mouse, a keyboard, a touch screen, a microphone and/or a remote controller. The output device 2008 may be any type of device capable of presenting information, and may include, but is not limited to, a display, a loudspeaker, a video/audio output terminal, a vibration device and/or a printer. The computing device 2000 may comprise a non-transitory storage device 2010 or be connected to a non-transitory storage device 2010; the non-transitory storage device may be any storage device that is non-transitory and capable of realizing data storage, and may include, but is not limited to, a magnetic disk drive, an optical storage device, a solid-state memory, a floppy disk, a flexible disk, a hard disk, a magnetic tape or any other magnetic medium, an optical disk or any other optical medium, ROM (read-only memory), RAM (random access memory), a cache and/or any other memory chip or box, and/or any other medium from which a computer can read data, instructions and/or code. The non-transitory storage device 2010 may be removed from an interface. The non-transitory storage device 2010 may have data/a program (including instructions)/code for realizing the abovementioned method and steps. The computing device 2000 may also comprise a communication device 2012. The communication device 2012 may be any type of device or system enabling communication with an external device and/or with a network, and may include, but is not limited to, a modem, a network card, an infrared communication device, a wireless communication device and/or a chipset, e.g. a Bluetooth™ device, a 1302.11 device, a Wi-Fi device, a WiMAX device, a cellular communication device and/or similar.

The computing device 2000 may also comprise a working memory 2014, which may be any type of working memory capable of storing a program (comprising instructions) and/or data that is useful to the working of the processor 2004, and may include, but is not limited to a RAM and/or a ROM device.

Software elements (programs) may be located in the working memory 2014, including but not limited to an operating system 2016, one or more application program 2018, a driver and/or other data and code. Instructions for executing the abovementioned method and steps may be included in the one or more application program 2018, and the abovementioned MRI method may be realized by the processor 2004 reading and executing the instructions of the one or more application program 2018. More specifically, in the abovementioned MRI method, steps S1 to S30, S10 to S50, and step S101, steps S201 to S204, steps S301 to S307, steps S401 to S404, and steps S501 to S503 may for example be realized by the processor 2004 executing the application program 2018 having instructions of steps S10 to S50, and step S101, steps S201 to S204, steps S301 to S307, steps S401 to S404, and steps S501 to S503. In addition, other steps in the abovementioned MRI method may for example be realized by the processor 2004 executing the application program 2018 having instructions in the execution of the corresponding steps. Executable code or source code of instructions of software elements (programs) may be stored in a non-transitory computer-readable storage medium (e.g. the abovementioned storage device 2010), and when executed, may be stored in the working memory 2014 (possibly compiled and/or installed). Executable code or source code of instructions of software elements (programs) may also be downloaded from a remote position.

It should also be understood that various changes in form may be carried out according to particular requirements. For example, it is also possible to use custom hardware, and/or to use hardware, software, firmware, middleware, microcode, hardware description language or any combination thereof to realize specific elements. For example, some or all of the disclosed methods and devices may be realized by using assembly language or hardware programming language (such as VERILOG, VHDL, C++) to program hardware (e.g. a programmable logic circuit comprising a field programmable gate array (FPGA) and/or a programmable logic array (PLA)), using logic and algorithms according to the present disclosure.

It should also be understood that the abovementioned method may be realized through a server-client mode. For example, a client may receive data inputted by a user and send the data to a server. The client may also receive data inputted by the user, execute part of the processing in the abovementioned method, and send the data obtained by processing to the server. The server may receive the data from the client, and execute the abovementioned method or another part of the abovementioned method, and return the execution result to the client. The client may receive the method execution result from the server, and for example may present it to the user via an output device.

It should also be understood that components of the computing device 2000 may be distributed on a network. For example, one processor may be used to perform some processing, and at the same time, other processing may be performed by another processor remote from said one processor. Other components of the computing system 2000 may also be similarly distributed. Thus, the computing device 2000 may be interpreted as being a distributed computing system that performs processing in multiple locations.

Although embodiments or examples of the present disclosure have already been described with reference to the drawings, it should be understood that the abovementioned method, system and device are merely exemplary embodiments or examples, and the scope of the present disclosure is not limited by these embodiments or examples, instead being defined solely by the granted claims and the equivalent scope thereof. Each key element in the embodiments or examples may be omitted or may be replaced by an equivalent key element thereof. In addition, the steps may be performed in a sequence different from that described in the present disclosure. Furthermore, various key elements in the embodiments or examples may be combined in various ways. Importantly, as technology evolves, many key elements described here may be replaced by equivalent key elements appearing after the present disclosure.

As used herein, "schematic" means "serving as an instance, example or illustration". No drawing or embodiment described herein as "schematic" should be interpreted as being a more preferred or more advantageous technical solution.

To make the drawings appear uncluttered, only those parts relevant to the present disclosure are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked.

In this text, "a" does not only mean "just this one"; it may also mean "more than one". As used herein, "first" and "second" etc. are merely used to differentiate between parts, not to indicate their order or degree of importance, or any precondition of mutual existence, etc. In addition, the term "and/or" used herein encompasses any one of the listed items and all possible combinations. For example, A and/or B may mean that A exists independently, A and B exist simultaneously, or B exists independently. Furthermore, the symbol "/" herein generally means that the objects before and after it are related by an "or" relationship.

The various components described herein may be referred to as "units." As noted above, such components may be implemented via any suitable combination of parts, components, hardware, and/or software components as applicable and/or known to achieve the intended respective functionality. This may include mechanical and/or electrical components, FPGAs, processors, processing circuitry, or other suitable hardware components configured to execute instructions or computer programs that are stored on a suitable computer readable medium. Regardless of the particular implementation, such units or modules when applicable and relevant may alternatively be referred to herein as "circuitry," "processors," or "processing circuitry."

What is claimed is:

1. A method, comprising:
    acquiring magnetic resonance (MR) data via at least one receiving coil, the MR data (i) occupying a central region of a first k-space along a Cartesian trajectory under gradient magnetic field control with full sampling, and (ii) occupying a peripheral region of the first k-space along a non-Cartesian trajectory under gradient magnetic field control with undersampling;
    reconstructing first image data to construct a second k-space based on extraction of MR data occupying the non-Cartesian trajectory in the peripheral region of the first k-space, the reconstruction of the first image data comprising using a sparse representation of first image data in a transform domain to perform suppression of artifacts caused by the undersampling in the first image data during image reconstruction,
    wherein MR data that occupies a Cartesian trajectory in the second k-space is obtained by transformation based on the reconstructed first image data; and
    generating an MR image k-space that is suitable for MR imaging based on a synthesis of the second k-space identified with MR data occupying the Cartesian trajectory in the central region of the first k-space.

2. The method as claimed in claim 1, further comprising:
    acquiring sensitivity distribution information associated with multiple receiving coils.

3. The method as claimed in claim 2, wherein the act of reconstructing the first image data to construct the second k-space further comprises performing parallel imaging with the aid of the sensitivity distribution information.

4. The method as claimed in claim 2, wherein the act of reconstructing the first image data to construct the second k-space comprises:
    subjecting MR data occupying the non-Cartesian trajectory in peripheral regions of multiple respective ones of first k-spaces to parallel imaging to obtain the first image data;
    using a sparse representation of the first image data in a transform domain to suppress artifacts caused by the undersampling in the first image during image reconstruction to obtain the reconstructed first image data; and
    applying a Fourier transform to obtain the second k-space based on the reconstructed first image data.

5. The method as claimed in claim 2, wherein the act of generating the MR image k-space comprises:
    applying the sensitivity distribution information to MR data occupying the Cartesian trajectory in the central region of multiple respective ones of first k-spaces corresponding to the multiple receiving coils to construct a third k-space.

6. The method as claimed in claim 5, wherein the act of applying the sensitivity distribution information occupying the Cartesian trajectory in the central region of multiple respective ones of first k-spaces corresponding to the multiple receiving coils to construct the third k-space comprises:
    applying the sensitivity distribution information based on a transformation to an image domain of MR data of the Cartesian trajectory occupied by the central region of the multiple respective ones of first k-spaces corresponding to the multiple receiving coils and a multiplication with a conjugate of the sensitivity distribution information; and
    obtaining second image data to construct the third k-space by performing merging according to measurement channels corresponding to the multiple receiving coils.

7. The method as claimed in claim 5, applying the sensitivity distribution information occupying the Cartesian trajectory in the central region of multiple respective ones of first k-spaces corresponding to the multiple receiving coils to construct the third k-space comprises:
    extracting MR data of the occupied Cartesian trajectory in the central region from the respective ones of the first k-spaces, and using zero filling in a region outside the central region with reference to the sensitivity distribution information to obtain multiple Cartesian point sets of a same size as a matrix of the sensitivity distribution information, the multiple Cartesian point sets corresponding to an acquisition via the multiple receiving coils;

applying an inverse Fourier transform to the multiple Cartesian point sets to obtain multiple sets of third image data;

using the conjugate of the sensitivity distribution information for multiplication with the respective sets of third image data; and obtaining second image data to perform a transformation to the third k-space by performing a merging according to measurement channels corresponding to the multiple receiving coils.

8. The method as claimed in claim 5, wherein the act of generating the MR image k-space further comprises:

replacing MR data of the Cartesian trajectory occupied by the central region of the second k-space with MR data of a Cartesian trajectory occupied by a corresponding region in the third k-space, wherein a central region of the second k-space has a same size as the central region of the first k-space.

9. The method as claimed in claim 1, wherein the reconstructed first image data is reconstructed with the aid of compressed sensing.

10. The method as claimed in claim 1, wherein the non-Cartesian trajectory is a 3D radial trajectory.

11. The method as claimed in claim 1, wherein the act of generating the MR image k-space comprises:

generating the MRI k-space based on an extraction of data occupying the Cartesian trajectory in the central region of the first k-space to replace data occupying a Cartesian trajectory in a corresponding central region in the second k-space.

12. The method as claimed in claim 2, wherein the act of acquiring the sensitivity distribution information comprises:

applying gridding processing to the first k-space to generate a gridded first k-space;

removing a high-frequency portion from the gridded first k-space to extract and generate a low-resolution image; and computing the sensitivity distribution information based on the low-resolution image.

13. The method as claimed in claim 12, wherein Iterative self-consistent parallel imaging reconstruction using eigenvector maps (ESPIRiT) is applied to the low-resolution image to obtain the sensitivity distribution information by computing an eigenvector from a null space.

14. A magnetic resonance imaging (MRI) system, comprising:

at least one receiving coil;

a magnetic resonance controller; and a memory storing a program comprising executable instructions, wherein the magnetic resonance controller is configured to execute the instructions to cause the MRI system to:

acquire magnetic resonance (MR) data via at least one receiving coil, the MR data (i) occupying a central region of a first k-space along a Cartesian trajectory under gradient magnetic field control with full sampling, and (ii) occupying a peripheral region of the first k-space along a non-Cartesian trajectory under gradient magnetic field control with undersampling;

reconstruct first image data to construct a second k-space based on extraction of MR data occupying the non-Cartesian trajectory in the peripheral region of the first k-space, the reconstructing of the first image data comprising using a sparse representation of first image data in a transform domain to perform suppression of artifacts caused by the undersampling in the first image data during image reconstruction, wherein MR data that occupies a Cartesian trajectory in the second k-space is obtained by transformation based on the reconstructed first image data; and generate an MR image k-space that is suitable for MR imaging based on a synthesis of the second k-space identified with MR data occupying the Cartesian trajectory in the central region of the first k-space.

15. A non-transitory computer-readable storage medium storing machine-readable instructions that, when executed by an electronic device, cause the electronic device to:

acquire magnetic resonance (MR) data via at least one receiving coil, the MR data (i) occupying a central region of a first k-space along a Cartesian trajectory under gradient magnetic field control with full sampling, and (ii) occupying a peripheral region of the first k-space along a non-Cartesian trajectory under gradient magnetic field control with undersampling;

reconstruct first image data to construct a second k-space based on extraction of MR data occupying the non-Cartesian trajectory in the peripheral region of the first k-space, the reconstructing of the first image data comprising using a sparse representation of first image data in a transform domain to perform suppression of artifacts caused by the undersampling in the first image data during image reconstruction, wherein MR data that occupies a Cartesian trajectory in the second k-space is obtained by transformation based on the reconstructed first image data; and generate an MR image k-space that is suitable for MR imaging based on a synthesis of the second k-space identified with MR data occupying the Cartesian trajectory in the central region of the first k-space.

* * * * *